(12) United States Patent
Chrysler et al.

(10) Patent No.: US 6,213,194 B1
(45) Date of Patent: Apr. 10, 2001

(54) HYBRID COOLING SYSTEM FOR ELECTRONICS MODULE

(75) Inventors: Gregory M. Chrysler, Chandler, AZ (US); Richard C. Chu, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/338,254

(22) Filed: Jun. 22, 1999

Related U.S. Application Data

(60) Continuation-in-part of application No. 09/228,383, filed on Jan. 12, 1999, which is a division of application No. 09/060,847, filed on Apr. 15, 1998, now Pat. No. 5,896,922, which is a division of application No. 08/975,852, filed on Nov. 21, 1997, which is a continuation-in-part of application No. 08/896,279, filed on Jul. 16, 1997, now abandoned, which is a continuation-in-part of application No. 09/130,358, filed on Aug. 7, 1998, which is a division of application No. 08/976,352, filed on Nov. 21, 1997.

(51) Int. Cl.7 ........................................................ F28F 7/00
(52) U.S. Cl. ...................... 165/80.3; 165/80.4; 62/259.2; 361/696; 361/697; 257/714; 257/722
(58) Field of Search ................................. 165/80.3, 80.4, 165/185; 361/697, 704, 710, 699, 696; 257/719, 722; 62/259.2

(56) References Cited

U.S. PATENT DOCUMENTS

| | | |
|---|---|---|
| 2,869,330 | 1/1959 | Kramer . |
| 2,953,906 | 9/1960 | Quick . |
| 2,963,877 | 12/1960 | Malkoff et al. . |
| 3,917,370 | 11/1975 | Thornton et al. ................... 339/16 R |
| 4,583,583 | 4/1986 | Wittel ..................................... 165/46 |
| 4,674,704 | * 6/1987 | Altoz et al. .......................... 244/1 R |
| 4,977,444 | 12/1990 | Nakajima et al. ...................... 357/82 |
| 4,984,433 | 1/1991 | Worthington ............................. 62/90 |
| 5,036,384 | 7/1991 | Umezawa ................................ 357/82 |
| 5,054,294 | 10/1991 | Dudley ................................ 62/228.4 |
| 5,144,531 | 9/1992 | Go et al. ............................... 361/382 |
| 5,150,274 | 9/1992 | Okada et al. ......................... 361/382 |
| 5,285,347 | * 2/1994 | Fox et al. ............................ 165/80.4 |
| 5,304,846 | 4/1994 | Azar et al. ........................... 257/722 |
| 5,365,749 | * 11/1994 | Porter ................................. 62/259.2 |
| 5,474,120 | * 12/1995 | Severson et al. ..................... 165/298 |
| 5,630,469 | 5/1997 | Butterbaugh et al. ............. 165/80.3 |
| 5,896,922 | 4/1999 | Chrysler et al. ..................... 165/165 |
| 5,959,837 | * 9/1999 | Yu ........................................ 361/697 |
| 6,043,980 | * 3/2000 | Katsui .................................. 361/695 |

FOREIGN PATENT DOCUMENTS 405-304381A   11/1993   (JP) .

\* cited by examiner

*Primary Examiner*—Allen Flanigan
(74) *Attorney, Agent, or Firm*—Lily Neff Esq.; Heslin & Rothenberg, P.C.

(57) ABSTRACT

A d.c. motor together with a hot gas bypass valve is incorporated into a cooling system specifically designed for removing heat from a computer system. Unlike typical refrigeration systems, the cooling system herein runs continuously and responds to changes in thermal load. This allows the unit to operate within a wide range of ambient conditions and at various thermal load levels unlike other systems which were capable of operation only at a single, pre-designed load level. The cooling system is modular and is easily added to or removed from a redundant system which includes a single evaporator with multiple refrigerant loops which provides yet another aspect of continuous operation due to the inherent redundancy thus provided. In one embodiment, the cooling system includes a refrigeration cooled cold plate thermally coupled to an electronic module of a computer system, and an auxiliary air cooled heat sink thermally coupled to the refrigeration cooled cold plate.

11 Claims, 15 Drawing Sheets

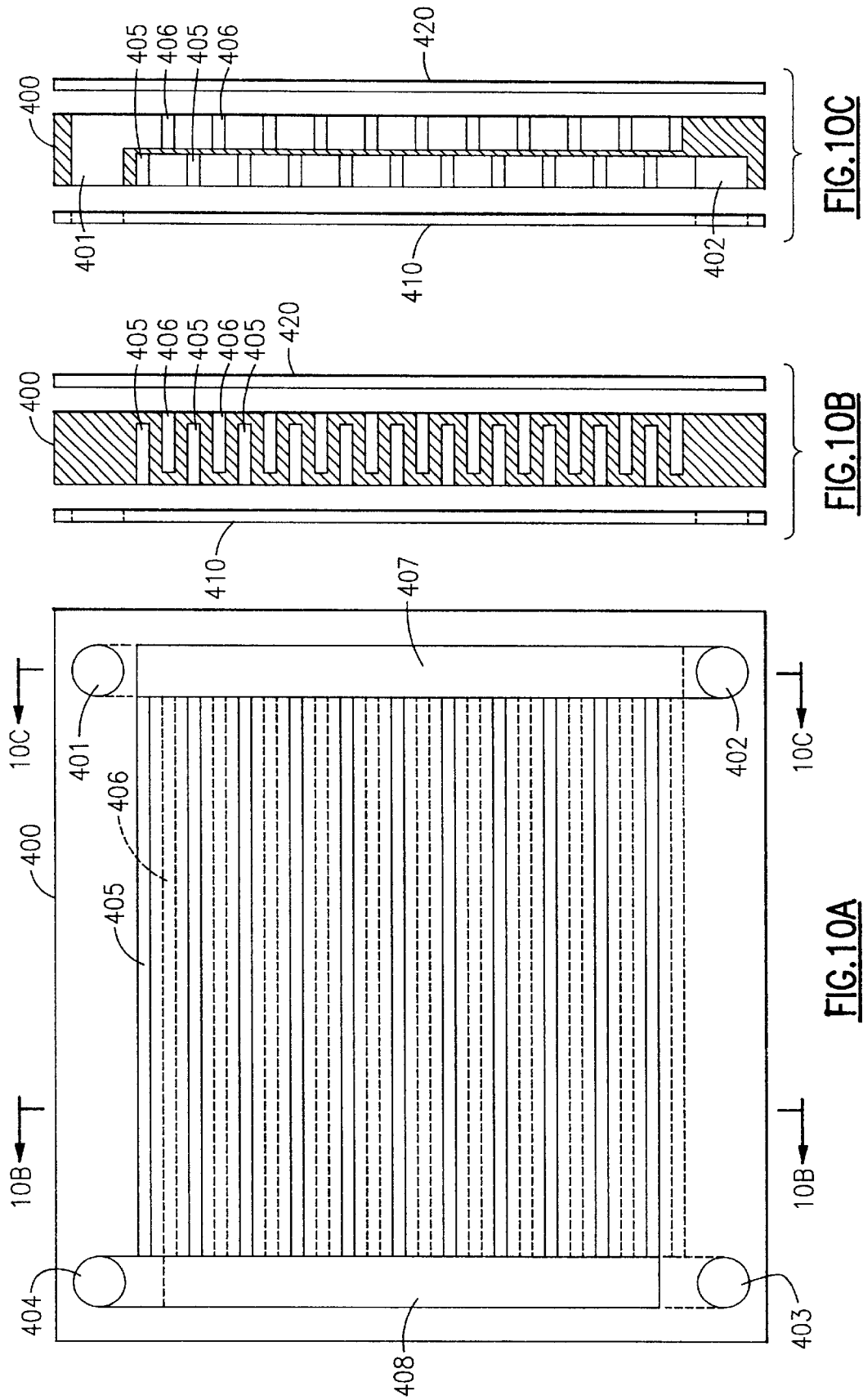

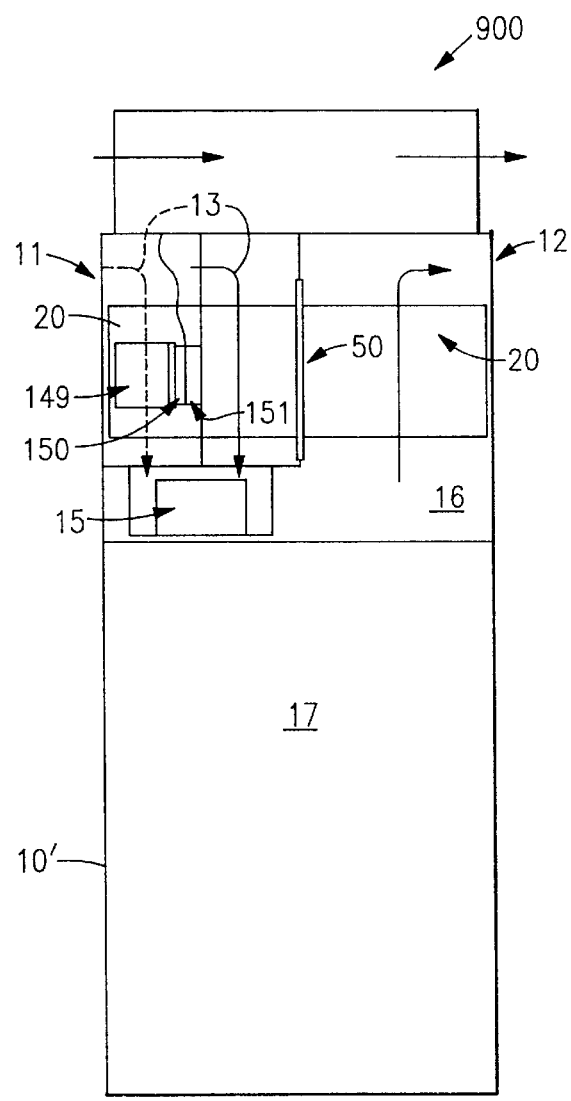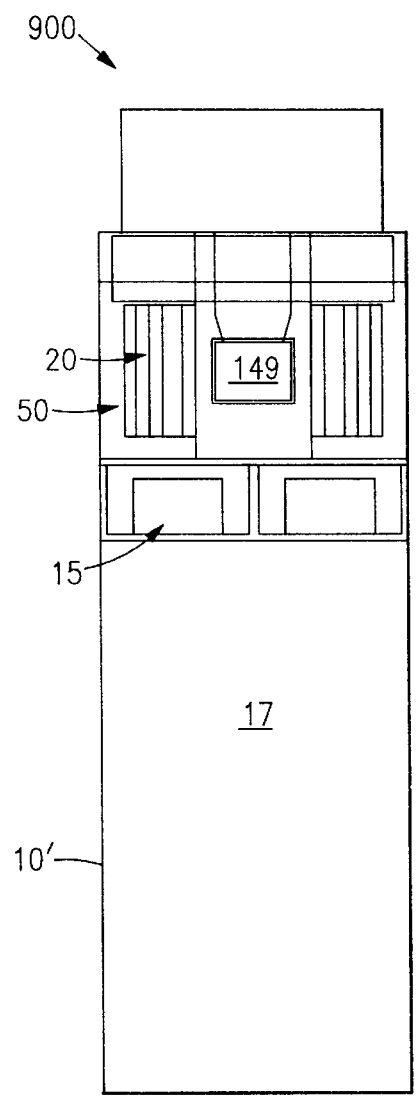
FIG.15A
FIG.15B

HYBRID COOLING SYSTEM FOR ELECTRONICS MODULE

CROSS-REFERENCE TO RELATED APPLICATION

This application claims the benefit of and is a continuation-in-part of commonly assigned, co-pending patent application Ser. No. 09/228,383, filed Jan. 12, 1999, by Chrysler et al., entitled "Cold Plate For Dual Refrigeration Systems", which is a divisional of Ser. No. 09/060,847 filed Apr. 15, 1998 U.S. Pat. No. 5,896,922, issued Apr. 27, 1999, which is a divisional of pending application Ser. No. 08/975,852, filed Nov. 21, 1997, which is a continuation-in-part of Ser. No. 08/896,279, filed Jul. 16, 1997, now abandoned.

Further, this application claims the benefit of and is a continuation-in-part from commonly assigned, co-pending patent application Ser. No. 09/130,358, filed Aug. 7, 1998, by Hare et al., entitled "Modular Refrigeration System," which is a divisional application of pending application Ser. No. 08/976,352, filed Nov. 21, 1997.

All of the above-referenced applications and issued Letters Patent are hereby incorporated herein by reference in their entirety.

TECHNICAL FIELD

The present invention is generally directed to providing reliable cooling systems for mainframe computer systems or for any electronic system requiring cooling. More particularly, the present invention is directed to redundant cooling systems, and in particular, to a hybrid auxiliary cooling system for an electronics module.

BACKGROUND OF THE INVENTION

In recent years, the semiconductor industry has taken advantage of the fact that CMOS circuits dissipate less power than bipolar circuits. This has permitted more dense packaging and correspondingly faster CMOS circuits. However, almost no matter how fast one wishes to run a given electronic circuit chip, there is always the possibility of running it faster if the chip is cooled and thermal energy is removed from it during its operation. This is particularly true of computer processor circuit chips and even more true of these chips when they are disposed within multi-chip modules (MCMs), which generate significant amounts of heat. Because there is a great demand to run these processor modules at higher speeds, the corresponding clock frequencies at which these devices must operate become higher. In this regard, it should be noted that it is known that power generation rises as a function of the square of the clock frequency. Accordingly, it is seen that the desire for faster computers generates not only demand for computer systems but also generates thermal demands in terms of energy which must be removed for faster, safer and more reliable circuit operation. In this regard, it is to be particularly noted that, in the long run, thermal energy is the single biggest impediment to semiconductor operation integrity.

In addition to the demand for higher and higher processor speeds, there is also a concomitant demand for reliable computer systems. This means that users are increasingly unwilling to accept down time as a fact of life. This is particularly true in the mainframe and server realms when zero down time and minimum maintenance requirements are typical goals. There are yet other requirements that must be met when designing cooling units for computer systems, especially those which operate continuously and which may in fact be present in a variety of different thermal environments. For example, the cooling system should be designed, controlled and set up so that various failure modalities do not bring the entire computer system down nor risk damage to the components within the system. All of these requirements must be considered in providing a cooling system for a computer system, particularly for a mainframe and/or server system.

DISCLOSURE OF THE INVENTION

Briefly summarized, the present invention comprises in one aspect a cooling system for an electronic module which includes a refrigeration cooled cold plate and an auxiliary air cooled heat sink. The refrigeration cooled cold plate is thermally coupled to the electronic module for removing heat generated by the electronic module via circulation fluid passing through the refrigeration cooled cold plate. The auxiliary air cooled heat sink is also thermally coupled to the electronic module to provide supplementary cooling of the electronic module. In an enhanced embodiment, the auxiliary air cooled heat sink is physically attached to the refrigeration cooled cold plate and thermally coupled to the electronic module across the refrigeration cooled cold plate.

In another aspect, the invention comprises a method for cooling a computer system having an electronic module. The method includes providing a refrigeration cooled cold plate thermally coupled to the electronic module for removing heat generated by the electronic module via circulation fluid passing through the refrigeration cooled cold plate. Additionally, an air cooled heat sink is provided thermally coupled to the refrigeration cooled cold plate. The air cooled heat sink is operated in one mode to cool air passing therethrough via its thermal coupling to the refrigeration cooled cold plate, thereby also cooling the ambient temperature of the computer system.

In a further aspect, a method for fabricating a cooling system for a computer system having an electronic module is provided. This method includes: providing a refrigeration cooled cold plate and thermally coupling the refrigeration cooled cold plate to the electronic module for removing heat generated by the electronic module; and thermally coupling an air cooled heat sink to the electronic module across the refrigeration cooled cold plate for auxiliary cooling of the electronic module.

Accordingly, it is an object of the present invention to provide a system and method for cooling computer and other electronic systems.

It is another object of the present invention to provide a cooling system which possesses redundancy for the purpose of providing uninterrupted use of electronic equipment.

It is also an object of the present invention to provide a cooling system for electronic equipment which essentially preserves its stand-alone, air-cooled nature.

It is yet another object of the present invention to provide a cooling system for electronic components in which air and refrigerant cooling are combined in an integrated package.

It is a still further object of the present invention to provide a cooling system for electronic assemblies, modules and cards.

It is also an object of the present invention to provide a cooling system for electronic components which include fail-safe means for operation in the event of a number of different failure modalities, including refrigerant leakage.

It is also an object of the present invention to provide a system and method for continued computer usage in the event of cooling system problems.

It is a still further object of the present invention to provide a cold plate for electronic component cooling which preserves refrigerant flow isolation while at the same time maintaining good thermal connectivity to a module to be cooled and also provides good thermal conduction and flow-wise isolation between dual refrigerant loops.

It is a still further object of the present invention to provide an electronic component cooling system which is self-contained.

It is also an object of the present invention to provide a computer or electronic system in which the refrigerant cooling system is a rack-mountable, field-replaceable unit.

It is also an object of the present invention to provide a cooling system for an electronic module which can be attached to a refrigeration system by means of flexible and detachable refrigerant supply lines.

It is yet another object of the present invention to provide a refrigeration unit which is capable of operating continuously.

It is still another object of the present invention to provide a refrigeration unit which is capable of variable heat removal capacity, particularly in response to varying thermal demands.

It is a still further object of the present invention to provide a refrigeration unit which is easily startable, easily shut down and is capable of running under low thermal load situations.

It is also an object of the present invention to provide a refrigeration system which is capable of operating in a wide range of ambient and thermal load conditions.

It is still another object of the present invention to provide a hybrid auxiliary cooling system for an electronic module which combines a refrigeration cooled cold plate and an auxiliary air cooled heat sink.

It is a still further object of the present invention to provide a hybrid auxiliary cooling system which provides for continued cooling of an electronics component notwithstanding inoperability of a refrigeration cooled cold plate coupled to the electronics module.

It is also an object of the present invention to provide for enhanced ambient cooling of a computer system commensurate with cooling of an electronics module of the computer system.

It is yet another object of the present invention to provide a hybrid auxiliary cooling system having a refrigerant cooled cold plate coupled to either a standard chiller unit supplying chilled water to the cold plate or an evaporation refrigerator supplying a refrigerant to the cold plate.

Lastly, but not limited hereto, it is an object of the present invention to provide a system and method for facilitating the operation of computer systems at higher speeds and, in particularly, for doing so in a reliable manner so as to be able to maintain such systems in continuous operation for as long a time as is reasonably possible.

BRIEF DESCRIPTION OF THE DRAWINGS

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 10A is a top view of a cold plate center portion illustrating an alternative parallel path arrangement for thermally coupled, yet flow-wise isolated channels;

FIG. 10B illustrates a cross-sectional view through the cold plate of FIG. 10A;

FIG. 10C is a cross-sectional view similar to FIG. 10B more particularly showing the cross section through an end manifold portion;

FIG. 15A is a side elevational view illustrating the arrangement of components in one computer system embodiment of the present invention employing the hybrid auxiliary cooling arrangement of FIG. 14; and FIG. 15B is a front elevational view of the computer system with hybrid auxiliary cooling of FIG. 15A in accordance with the principles of the present invention.

BEST MODE FOR CARRYING OUT THE INVENTION

Figures 1A, 1B:
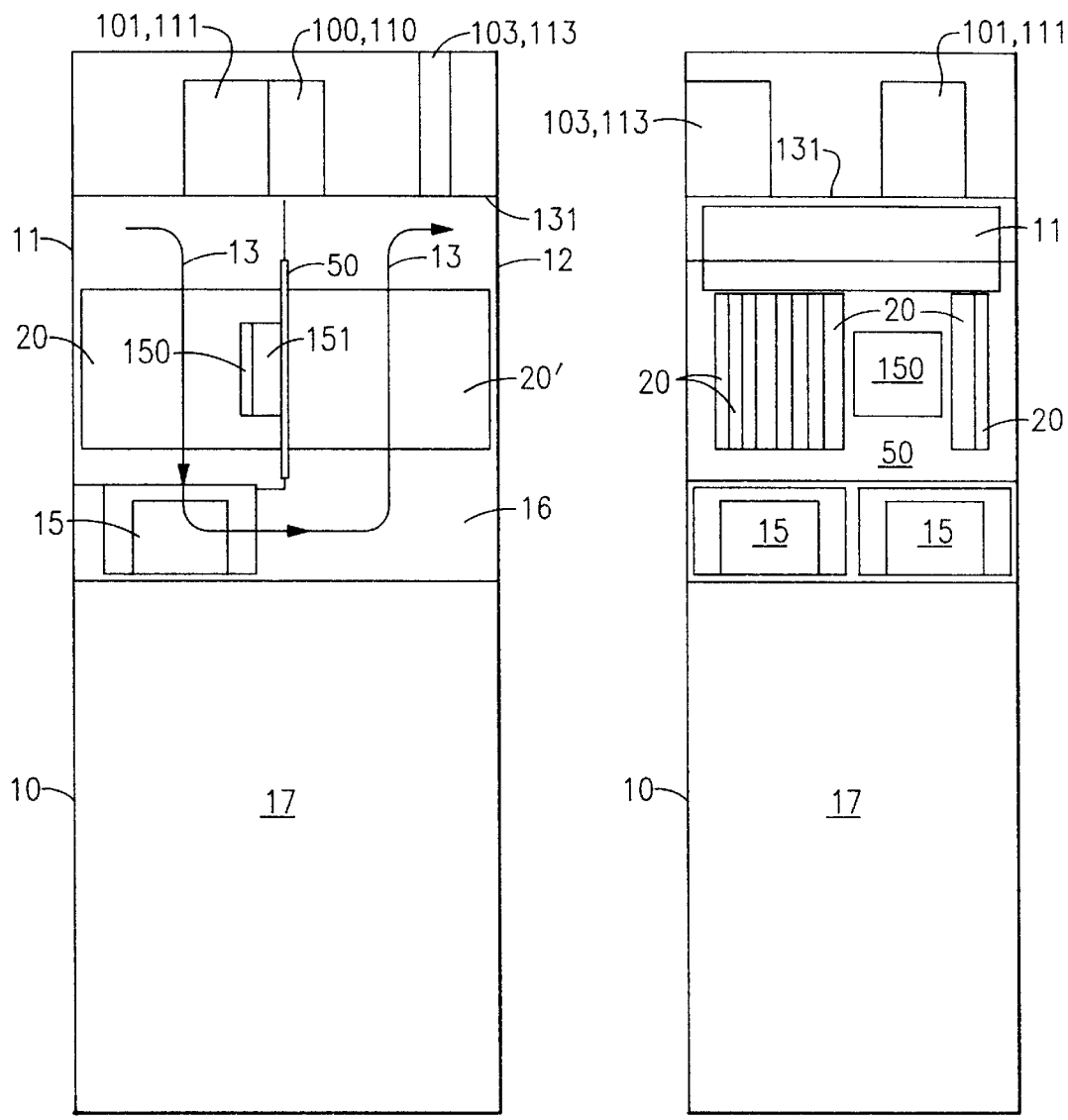
FIG. 1A is a side elevation view illustrating the arrangement of components in one embodiment of the present invention.
FIG. 1B is a view similar to FIG. 1A but more particularly illustrating a front view.

FIG. 1A illustrates a side view of one embodiment of the present invention. This invention employs cabinet 10 having inlet opening 11 and outlet opening 12 for the passage of air therethrough. The flow of air is induced by means of one or more blowers 15. Fans or other air-moving devices could also be employed for this same purpose. However, blowers are preferred because of their efficiency. In the apparatus shown in FIG. 1A, air moves from inlet 11 in cabinet 10 to exhaust 12 along air flow line 13. The flow of air is employed for the particular purpose of cooling certain of the electronic components disposed on printed circuit cards or so-called "books" 20. Air flows down between these books or cards through blower(s) 15 to plenum 16 and thence through cards 20' on the other side of mother board 50 into which books 20 are inserted. Thus, having flowed past cards 20 and 20', air stream 13 exits through exhaust 12 in cabinet 10.

The description provided thus far is therefore seen to disclose the primarily preferred method for cooling certain ones of the electronic components, namely, those components located on cards 20 and 20' which are of sufficiently low power that air cooling is an appropriate modality. However, an aspect of the present invention is directed to the specific means and systems employed for cooling electronic module 151. In certain embodiments of the present invention, module 151 includes circuits for data processor components associated with a mainframe or server computer system.

In particular, the system shown in FIGS. 1A and 1B illustrates the placement of cold plate 150 which forms an aspect of one embodiment of the present invention. Cold plate 150 is connected by means of flexible refrigerant lines (not shown for clarity) to a refrigeration system present in the upper portion of cabinet 10 above shelf-131. The refrigeration system for cooling cold plate 150 and, thus, module 151 includes items such as motors, compressors and condensers together with an expansion device. Thus, the system shown in FIGS. 1A and 1B represents an apparatus in which both air cooling and direct refrigerant cooling is employed. It is particularly useful for a proper understanding to note that electronic chip module 151 is not mounted in a sideways fashion as are cards 20 primarily because of the fact that module 151 typically possesses a very large number of pins for achieving connection and communication with other circuits in the computer and/or with other computer systems. Thus, the I/O (input/output) pin requirements for module 151 dictate that it preferably be mounted in the fashion shown. In FIG. 1B, this electronic module is shown disposed beneath cold plate 150 which is visible in FIG. 1B.

As shown in the figures, area 17 may include the same components as shown in the top half of the cabinet. Additionally, area 17 may also include power supply components (a power cage, e.g.) along with its own air-moving device. However the components disposed in area 17 are not otherwise relevant to the present invention.

Figure 2:
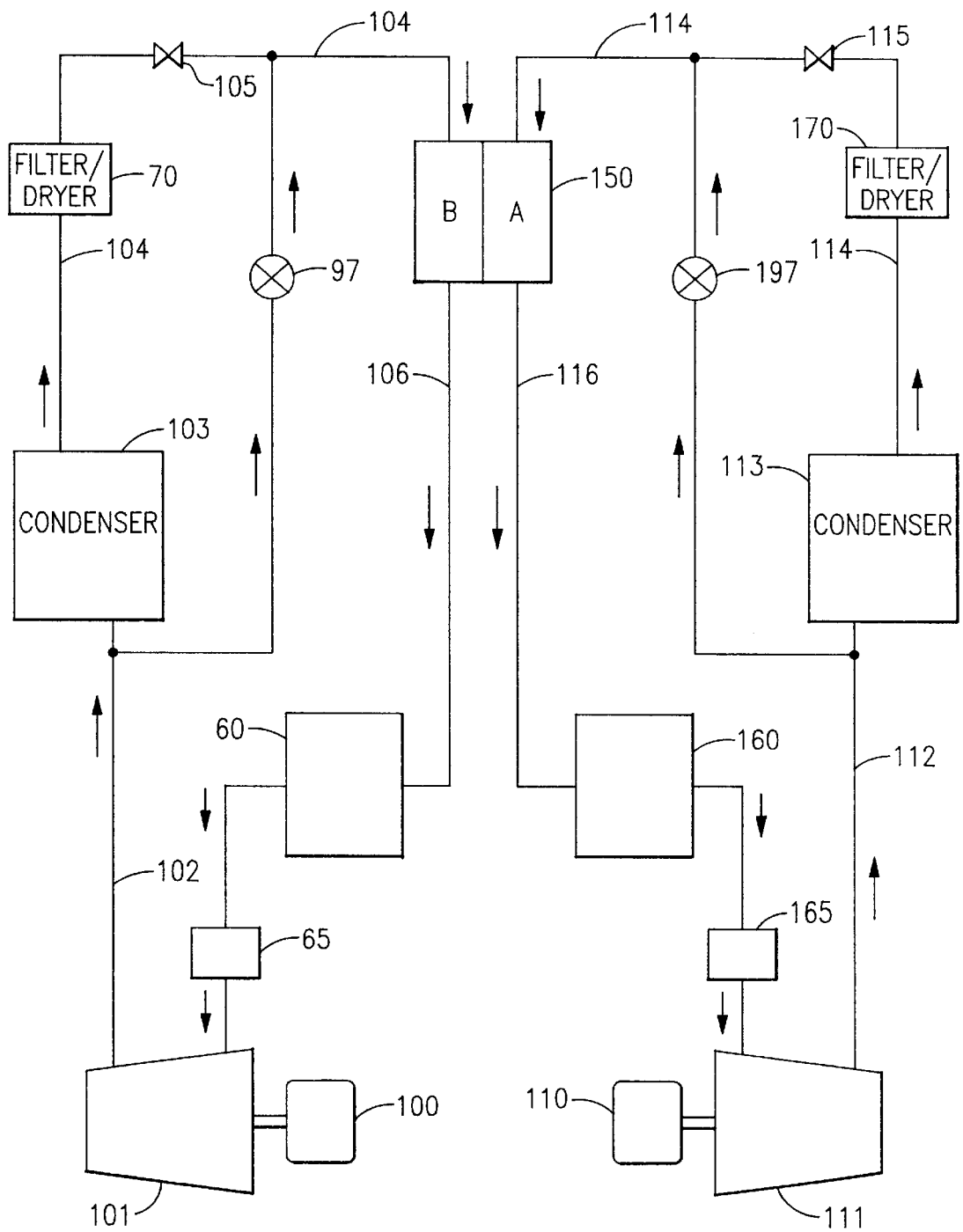
FIG. 2 is a block diagram illustrating a dual redundant refrigeration system for utilization with a cold plate in accordance with the present invention.

In order to provide the desired degree of system cooling redundancy, a dual refrigeration system, such as that shown in FIG. 2, is provided in accordance with certain embodiments of the present invention. The heart of this dual refrigeration system is the inclusion of cold plate 150 which has contained therein isolated coolant passages for a first refrigerant loop (circuit A) and a second refrigerant loop (circuit B). The cold plate itself may be constructed in several different ways. The cold plate and its construction is more particularly described below with reference to FIGS. 8A, 8B, 9A, 9B, 10A, 10B and 10C. The primary feature of cold plate 150 is that the coolant passages contained therein are isolated from one another in a flow-wise fashion. That is, cold plate 150 is designed so as to prevent leakage or seepage from one refrigerant loop (circuit A) to the other refrigerant loop (circuit B). In spite of the flow-wise isolation, the two coolant loops provided are, nonetheless, in intimate thermal contact with one another and with the body of the cold plate so as to remove heat from module 151 in an efficient manner.

Thus, in accordance with the redundancy aspect of the present invention, FIG. 2 illustrates a refrigerant system for circuit A and a refrigerant system for circuit B. In particular, motor 100 drives compressor 101 which is connected to condenser 103 by means of supply line 102. Likewise, condenser 103 is connected to circuit B for cold plate 150 by means of supply line 104 which passes through filter/dryer 70 which functions to trap particulate matter present in the refrigerant stream and also to remove any water which might have become entrained in the refrigerant flow. Subsequent to filter/dryer 70, refrigerant flow passes through expansion device 105. Expansion device 105 is preferably an expansion valve. However, it may also comprise a capillary tube or thermostatic valve. Thus, expanded and cooled refrigerant is supplied to circuit B in cold plate 150. Subsequent to its picking up heat from module 151 through the body of cold plate 150, the refrigerant is returned via return line 106 to accumulator 60 which operates to prevent liquid from entering compressor 101. Accumulator 60 is also aided in its function by the inclusion of smaller capacity accumulator 65 which is included in enhanced embodiments of the present invention to provide an extra degree of protection against the entry of liquid phase refrigerant into compressor 101. Subsequent to accumulator 65, vapor phase refrigerant is returned to compressor 101 where the cycle repeats. In addition, circuit A is provided with hot gas bypass value (HGBV) 97 which, as its name suggests, operates to pass hot refrigerant gasses from compressor 101 directly to cold plate 150. HGBV 97 is controllable in response to the temperature of cold plate 150 which is provided by module temperature sensor 185 which is preferably a thermistor device affixed to cold plate 150 at any convenient location. In preferred embodiments, HGBV 97 (and other HGBVs discussed herein) are electronically controlled. The HGBVs preferably employed herein are continuously throttle able but are currently operated in fully open and fully closed modes for convenience of design. The HGBVs operate to shunt hot gasses directly to cold plate 150 when its temperature is already sufficiently low. In particular, under these low temperature conditions, motor 100 runs at a lower speed in response to the reduced thermal load. At these lower speeds and loads, there is the danger of motor 101 stalling. Upon detection of such a condition, HGBV 97 is opened in response to a signal supplied to it from microprocessor control 195 (see FIG. 3).

In an exactly analogous fashion, refrigerant flows in the loop in circuit A which includes compressor 111, line 112, condenser 113, filter/dryer 170, expansion device 115, cold plate 150, return line 116 which connects to accumulator 160, which in turn connects (side A) to smaller accumulator 165 and thence back to compressor 111 which is driven by motor 110. As in circuit B, circuit A also includes HGBV 197, as shown.

The system shown in FIG. 2 lends itself to operation in several different modes. For example, it is possible to design each of the two separate refrigeration systems so that each one is capable of removing all of the desired heat generated by electronic module 151. If such is the case, it is not necessary to run both refrigeration systems at the same time. Nonetheless, because of the desirability of maintaining seals in a wetted or moistened state, it is not desirable to shut off either one of the two refrigeration systems for extended periods of time. Thus, in the circumstance where either refrigeration system is capable of providing the desired cooling, it is desired to control these systems in a manner so that as one is being shut down, the other is being turned on and being brought up to speed so that the other system may "rest". In preferred methods of operation, the separate refrigeration systems are each run for about 24 hours, at which time the other system is brought online and the first system is shortly thereafter shut down.

Figure 3:
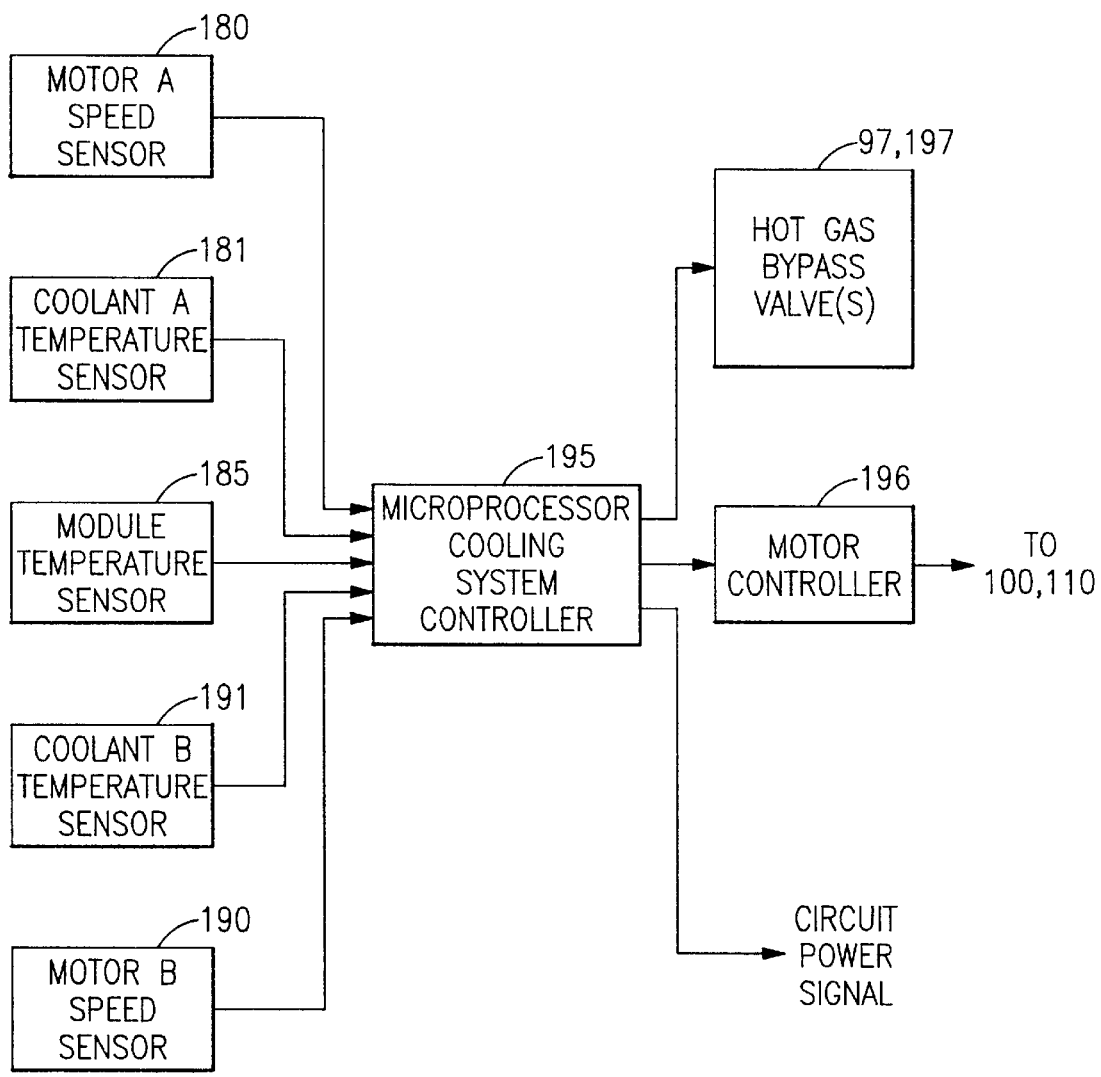
FIG. 3 is a block diagram illustrating the control system for operation of the redundant system shown in FIG. 2.

In those circumstances where the design of the refrigerant portions of the cooling system is such that both systems are required during normal operation, one must consider the possibility of the proper course of action to follow in the event that one of the refrigeration systems fails. Clearly, soft failure modalities are preferred. In order to effectuate such control, certain instrumentation readings are preferably provided to microprocessor cooling system controller 195, as shown in FIG. 3. Controller 195 has, as its principal design object, control of the temperature of module 151 and/or cold plate 150. In particular, desirable inputs for the cooling system controller include speed sensor 180 for motor A, speed sensor 190 for motor B, coolant temperature sensor 181 for circuit A, coolant temperature sensor 191 for circuit B and module temperature sensor 185 for module 151 and/or cold plate 150. Temperature sensors 181 and 191 are placed at the compressor exhaust and are used primarily for diagnostic purposes. Based upon these signal inputs, cooling system controller 195 provides signals to motor controller 196 to turn on either or both of motors 100 and 110 in FIG. 2.

Additionally, cooling system controller 195 also preferably provides a "circuit power signal" which is provided as input to electronic processor module 151 as a signal that there is a cooling system problem and that the module should be operated at reduced power levels, say for example, by causing a reduction in the clock speed. In this manner, a solution to the cooling system problem including refrigerant or refrigeration system replacement may be effected while at the same time maintaining computer center operations although at a reduced pace and at a concomitantly reduced thermal load. Furthermore, in normal modes of operation, microprocessor controller 195 also controls HGBVs 97 and 197, as discussed above. Microprocessor controller 195 may comprise a processor unit dedicated to control purposes or, in fact, the functions of microprocessor 195 may be provided by programming code running within computer processor modules which are cooled by the refrigeration system herein and more particularly by programming running within microcoded portions of such a computer processor.

Figure 4:
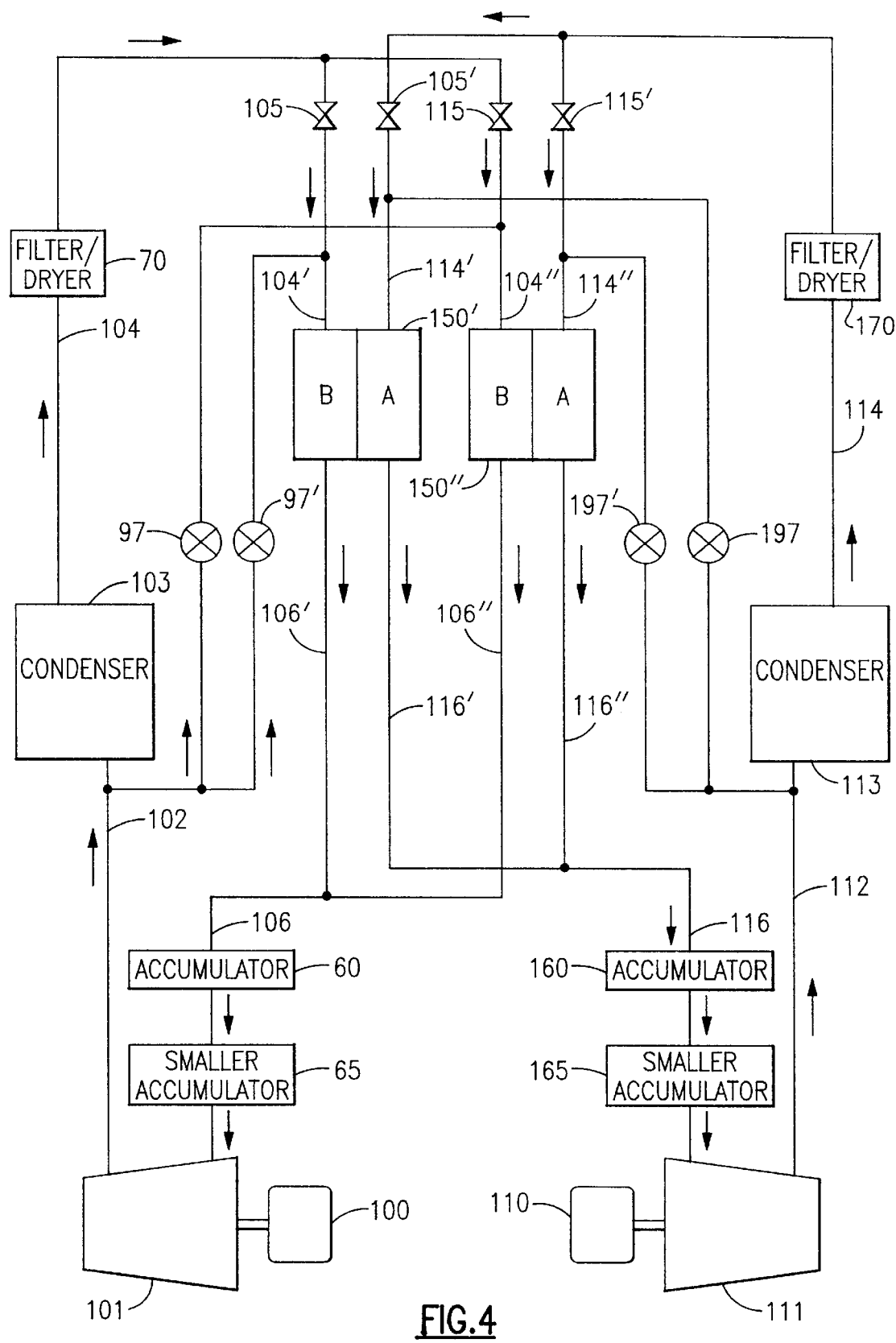
FIG. 4 is a functional block diagram illustrating an arrangement for a redundant cooling system for multiple electronic modules.

The redundant cooling system, shown in FIG. 2, is also employable in those situations where more than one electronic module is to be cooled. In these circumstances, each module is provided with its own cold plate and with its own expansion device. Accordingly, FIG. 4 illustrates the situation in which both cold plates 150' and 150" are to be cooled. In the situation shown in FIG. 4, each of the cold plates possesses dual passages which are thermally coupled but which are flow-wise isolated, that is, there is no flow communication between these passages.

Redundant cooling with flow isolation and refrigerant separation is maintained in the system shown in FIG. 4 by providing a supply line from condenser 103 to side B of cold plate 150' through line 104, filter/dryer 70, expansion device 105 and line 104'; similarly, supply line 104" supplies the circuit for side B of cold plate 150" from expansion device 115. Circuit B in both cases is completed by means of return lines 106' and 106" which return refrigerant from 150' and 150", respectively, either directly to compressor 101 or to common return line 106. (Accumulators 60 and 65, shown in FIG. 2, are also shown in FIG. 4.) Hot gas bypass valves 97 and 97' serve the same function as described above, only now HGBV 97 and HGBV 97' are controlled as a function of the temperature of cold plate 150' and HGBV 197' and HGBV 197 are controlled as a function of the temperature of cold plate 150". An exactly analogous system is provided for circuit loop A in cold plate 150" through the supply and return lines shown which include compressor 111, condenser 113, filter/dryer 170, HGBVs 197 and 197' and accumulators (160 and 165), and expansion devices 105' and 115' in a refrigerant loop.

Figure 5:
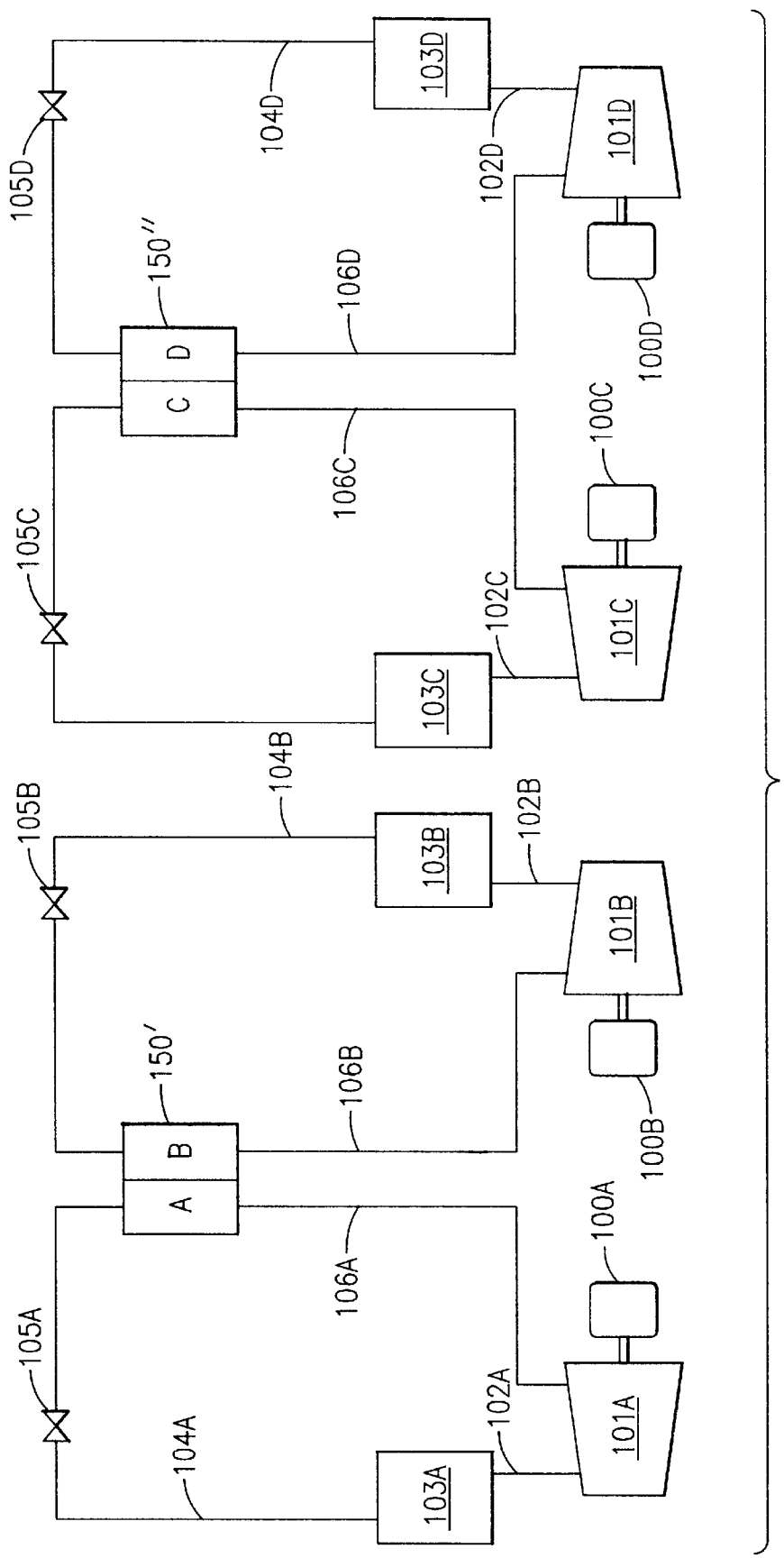
FIG. 5 is a view similar to FIG. 4 illustrating an alternative arrangement for the situation where multiple modules must be cooled.

FIG. 5 illustrates in simplified form another approach to the problem of cooling multiple modules 150' and 150". (For simplicity and ease of understanding, filter/dryers, accumulators and HGBVs are not shown since their placement and use is already clear from FIGS. 2 and 4.) In the embodiment shown in FIG. 5, the arrangement shown in FIG. 2 is essentially replicated for new cold plate 150". In the embodiment shown in FIG. 5, there are accordingly four separate cooling loops, namely, circuits A and B associated with compressors 101A and 101B, respectively. Likewise, coolant loops for sides C and D of evaporator 150" are associated with compressors 101C and 101D together with their appropriately and correspondingly labeled associated elements such as supply and coolant lines, expansion devices, condensers and motors. The multi-chip cooling solution illustrated in FIG. 5 is one possible alternative; however, it is not a preferred alternative in that it doubles the number of components (motors, compressors, condensers, accumulators, filter/dryers, HGBVs, etc.) that are required.

Figure 6:
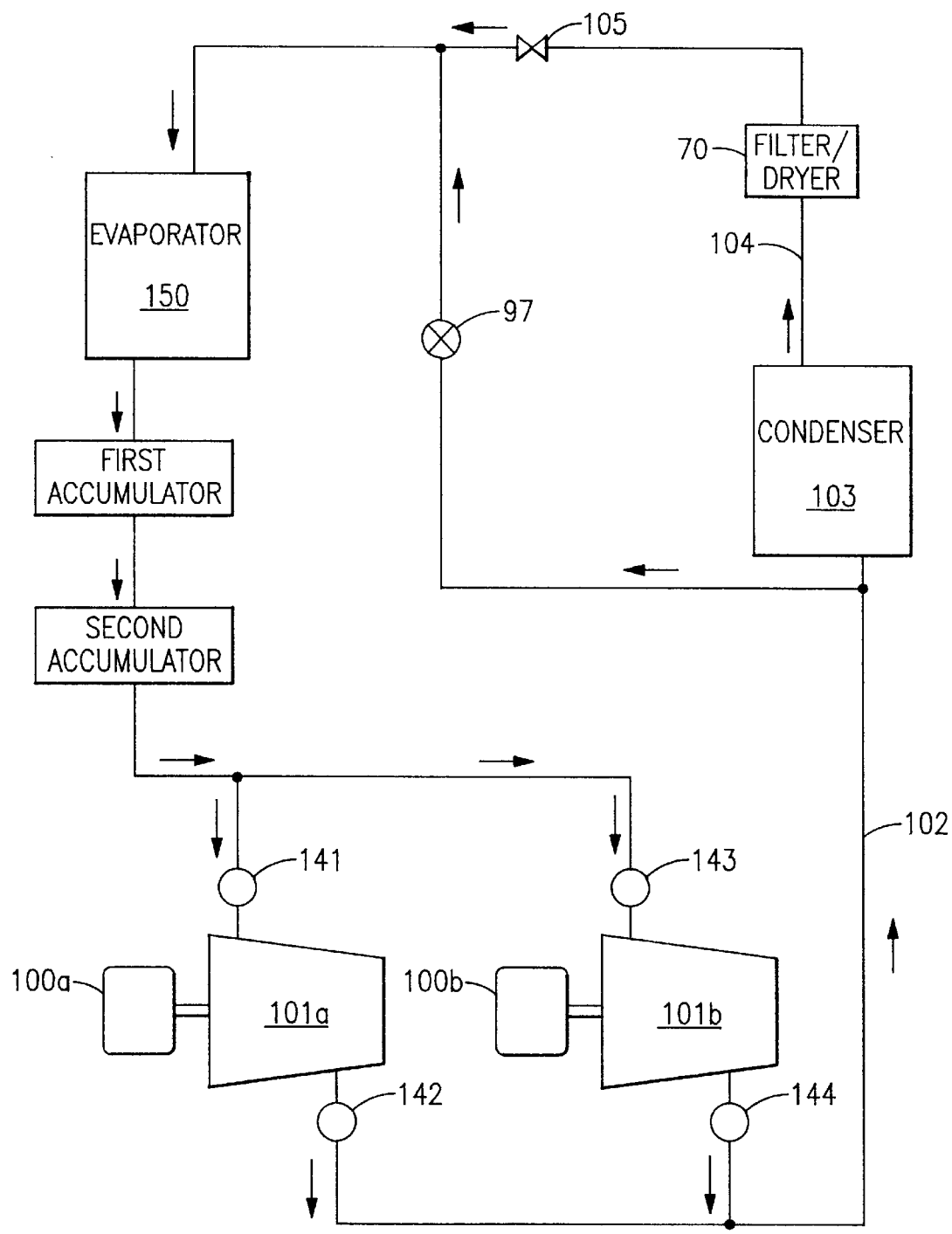
FIG. 6 is a functional block diagram illustrating an alternate redundancy arrangement for cold plate cooling.

Yet another embodiment which provides redundancy in a refrigeration cooling system for cold plate 150 is shown in FIG. 6. In this embodiment, redundancy is provided only insofar as the motors (100a and 100b) and the compressors (101a and 101b) are concerned. FIG. 6 has the advantage in that cold plate redesign is not required. In such an embodiment, cold plate 150 includes only a single coolant flow passage.

Nonetheless, the embodiment shown in FIG. 6 does provide a degree of redundancy by providing two motors and two compressors for compressing the refrigerant which is supplied to them via return line 106 from smaller accumulator 65 which is connected in the compressor return line to larger accumulator 60. The embodiment shown in FIG. 6 does not, however, provide redundancy protection, in the event that there is a problem (for example, a leak) in supply line 102, in condenser 103, in supply line 104, in expansion device 105, in cold plate 150 or in return line 106. Accordingly, the degree of redundancy protection provided by this embodiment is limited. Nonetheless, there is redundancy in that the electronic module cooled by cold plate 150 may still receive coolant from an operative one of the motor/compressor combinations. In such a circumstance, upon failure detection in one of the motor/compressor combinations, the other motor/compressor needs to be isolated from operating part of the system. Accordingly, for this purpose, shutoff valves 141 and 142 are actuated simultaneously to isolate compressor 101a. In a similar fashion, shutoff valves 143 and 144 serve to isolate compressor 101b.

This embodiment also employs HGBV 97 which functions as described above.

Figure 7:
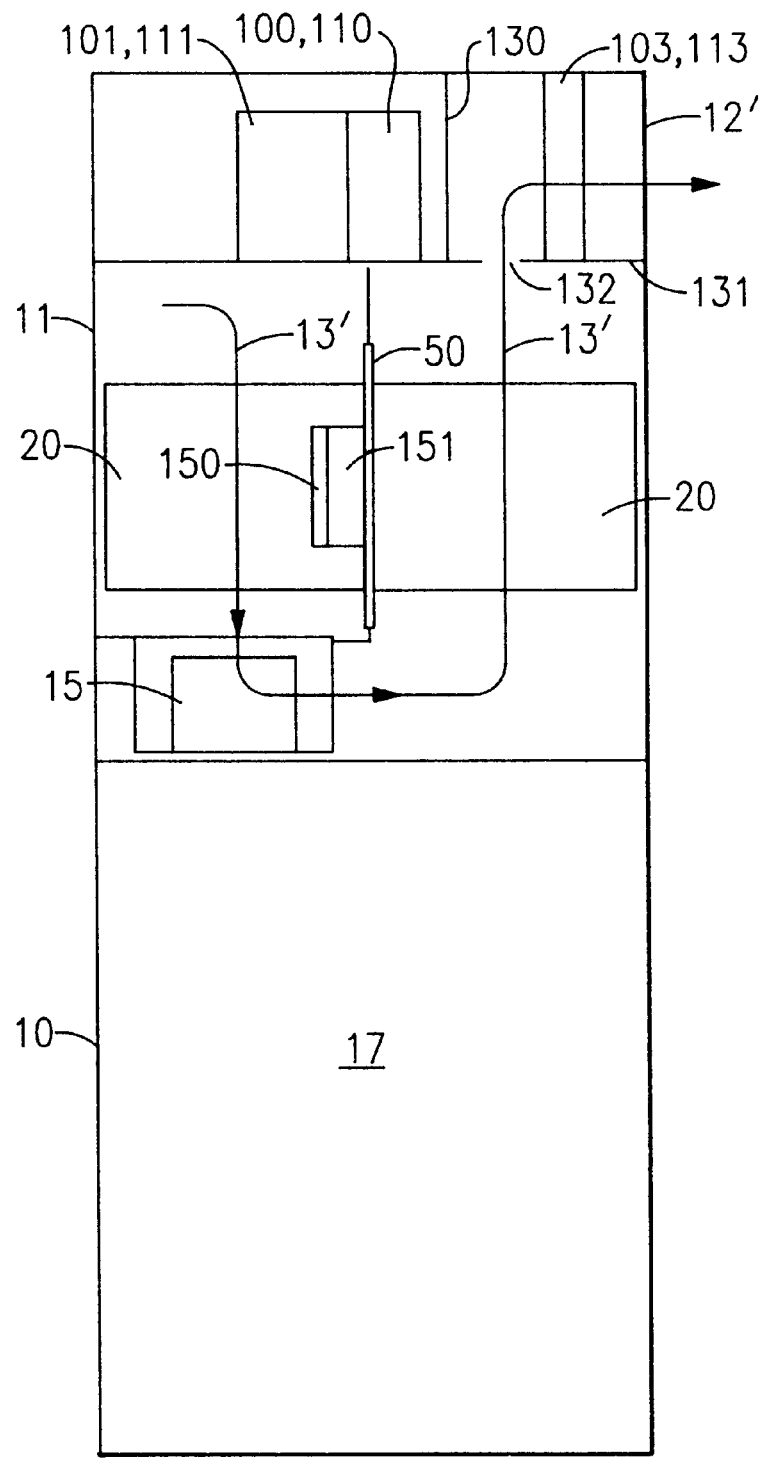
FIG. 7 is a side elevation view similar to FIG. 1A but more particularly illustrating an alternative air flow path.

Another embodiment of the present invention is illustrated in FIG. 7. FIG. 7 is similar to FIGS. 1A and 1B but it more particularly illustrates the fact that a different air circulation flow path 13' may be provided which also acts to remove heat from condensers 103 and/or 113. This mechanism is provided by opening 132 in shelf 131 (in cabinet 10) which supports the refrigeration components. Correspondingly, exhaust opening 12 is moved upward to position 12', as shown in FIG. 7. Since it is primarily desirable that the condensers be cooled as opposed to the motor-compressor combinations which may or may not require cooling, barrier 130 is provided to ensure that air flow path 13' is directed across condensers 103 and 113 through exhaust opening 12'.

Attention is next directed to the design of cold plate 150 (or 150' or 150" as appropriate). The embodiments shown in FIGS. 8A, 8B, 9A, 9B, 10A, 10B, 10C, 11A and 11B are particularly directed to those situations in which redundancy is provided in a manner which includes two entirely separate and distinct cooling circuits (referred to above as circuits A and B). These figures also include section lines B and C since, in each case, cross-sectional views are provided for a better understanding of the structure of the cold plate. In all of the cold plate embodiments illustrated in FIGS. 8–11, separate but thermally coupled flow passages are provided. In preferred embodiments of the present invention, cold plates illustrated in FIGS. 8–11 preferably comprise a material such as aluminum or copper. However, any highly thermally conductive material may be employed. However, it is desirable that the material be relatively easily machinable. Also, because it would be clearly difficult to provide a serpentine channel embedded in a monolithic piece of material, each of the cold plate constructions illustrated in FIGS. 8–11 employ a central path defining structure (200, 300, 400, 500) together with top plates (210, 310, 410, 510) and bottom plates (220, 320, 420, 520), respectively.

Figure 8B:
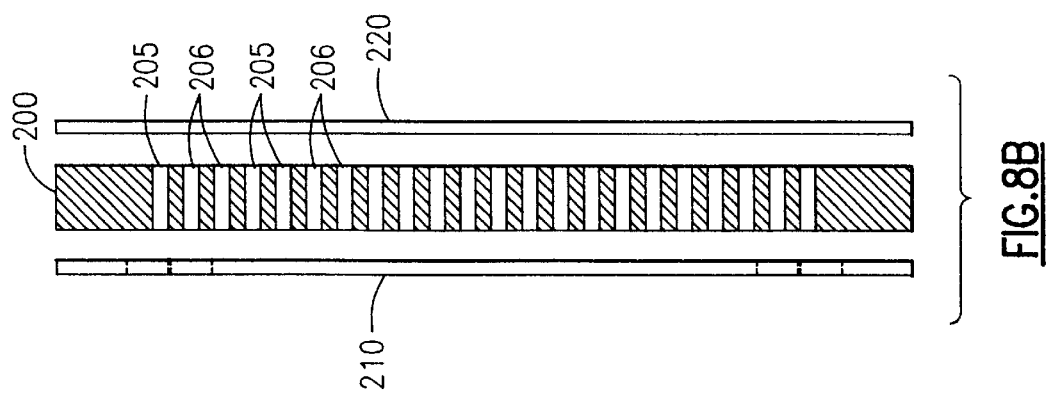
FIG. 8B is a side elevational cross-sectional view of the cold plate portion shown in FIG. 8A together with upper and lower sealing plates.
Figure 8A:
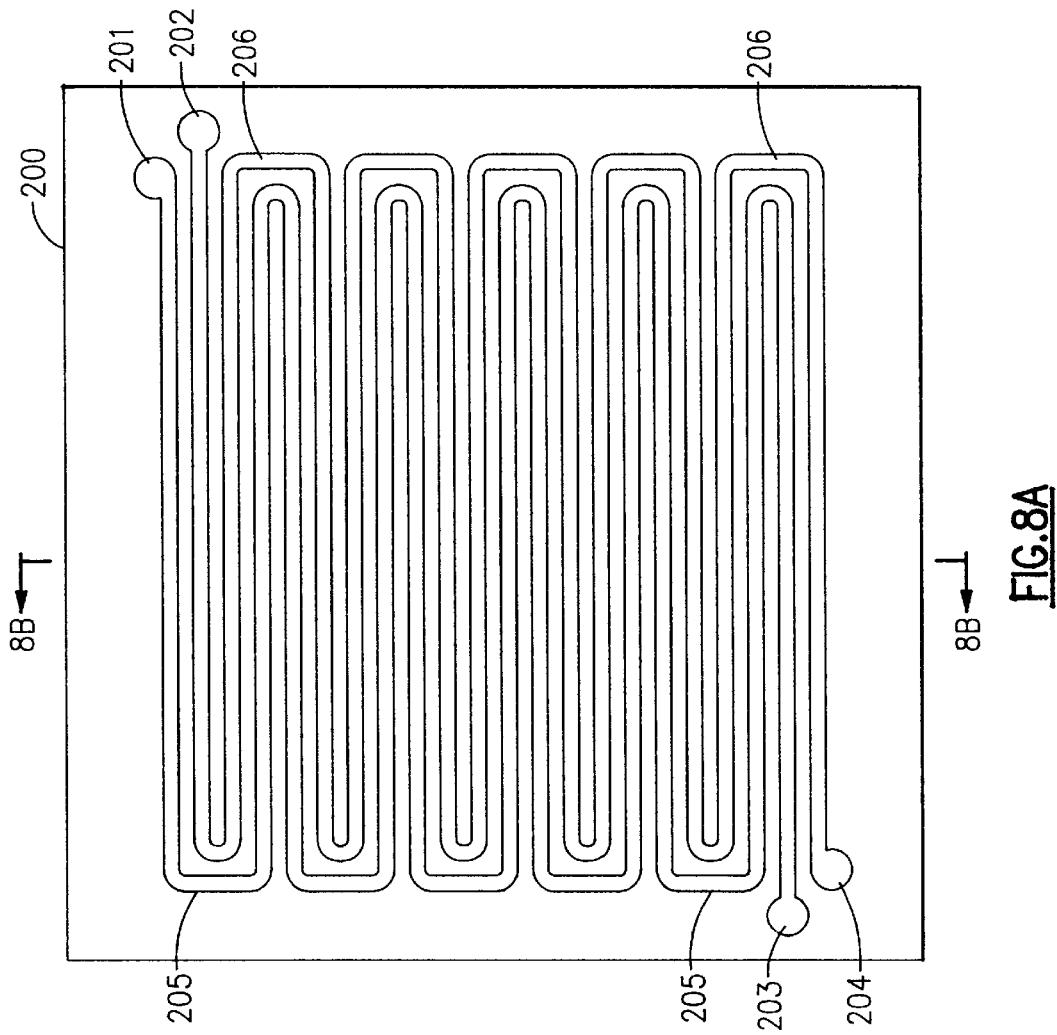
FIG. 8A is a top view of a central cold plate portion which provides the desired degree of thermal coupling and flow isolation desired in the present invention.

In one embodiment of a desirable cold plate such as that illustrated in FIGS. 8A and 8B, serpentine but isolated passages 205 and 206 are provided so that they co-exist at the same depth within central block 200. For purposes of cooling uniformity, both sets of passages 205 and 206 are arranged in a symmetric, serpentine, interdigitated fashion, such as that shown. Furthermore, passage 205 is provided with inlet opening 201 and exit opening 203. In a similar fashion, passage 206 is provided with outlet opening 202 and inlet opening 204. In this regard, it is particularly noted that, in preferred embodiments of the present invention, the dual passage cold plate is connected into the refrigeration system so that the inlet for circuit A is adjacent to the outlet for circuit B in the cold plate itself. In those circumstances where both circuits are being operated at the same time, this arrangement provides a more uniform cooling of the electronic module. This same preference also applies to the cold plate embodiment illustrated in FIGS. 9A and 9B.

Figure 9B:
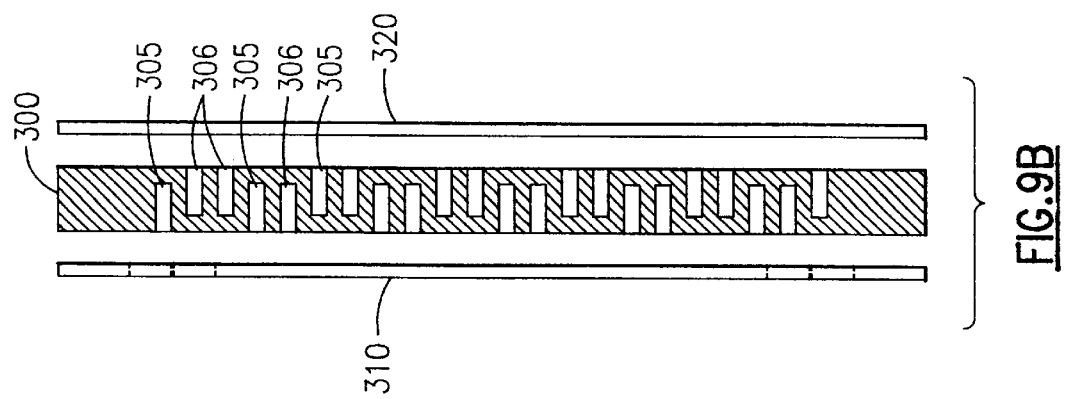
FIG. 9B is a cross-sectional view of the cold plate portion of FIG. 9A further including top and bottom sealing plates.
Figure 9A:
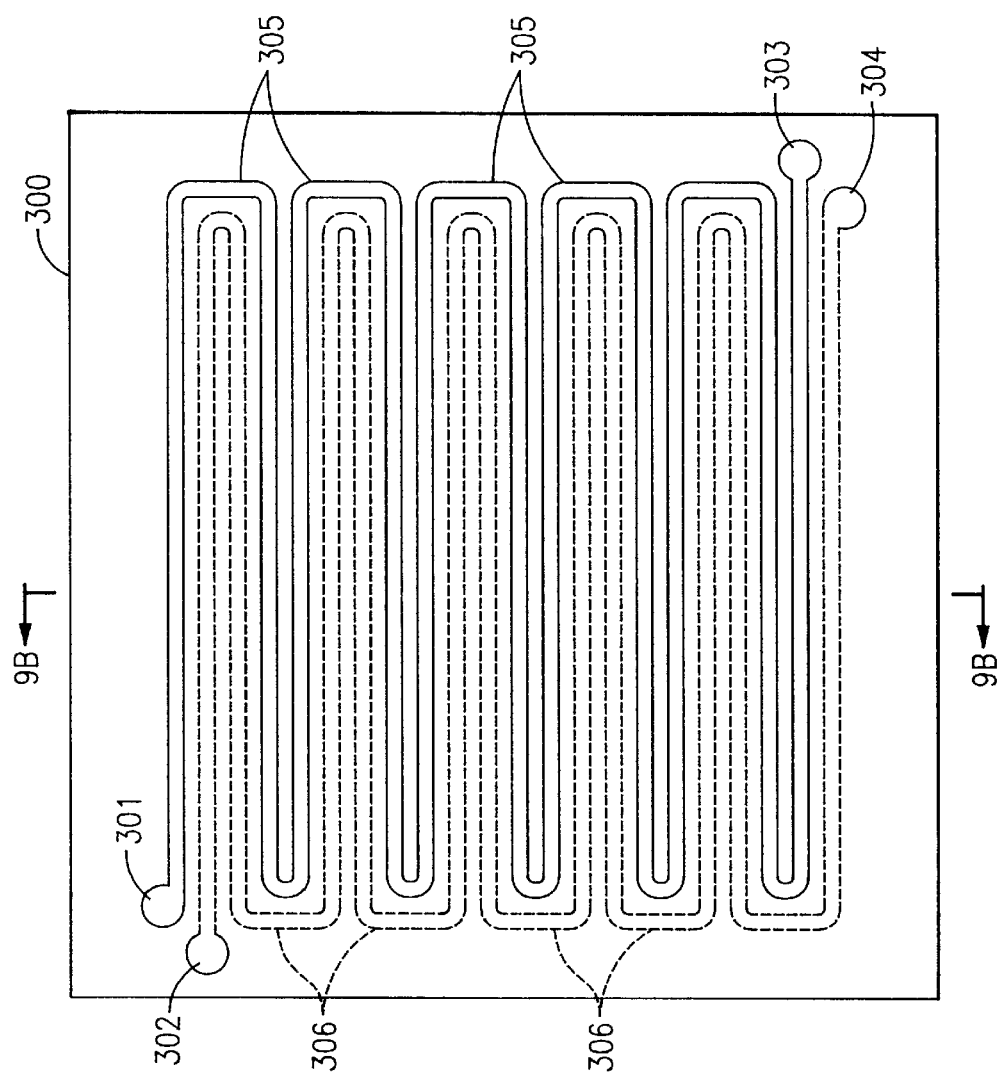
FIG. 9A is a view similar to FIG. 8A but more particularly illustrating a situation in which the flow paths are provided in more isolated channels on opposite sides of the central plate portion.

In particular, the cold plate design shown in FIGS. 9A and 9B is such that separate cooling passages 305 and 306 are provided in much the same way as shown in FIGS. 8A and 8B except that passage 306 lies at the bottom of the cold plate while passage 305 is disposed at the top (as seen in FIG. 9A). This is more particularly illustrated in the cross-sectional view shown in FIG. 9B. In the same manner as discussed above, passage 305 includes inlet opening 301 and exit opening 303 for connection to coolant circuit A or B. In a similar manner, passage 306 is provided with exit opening 302 and entrance opening 304. Naturally, the role of exit and entrance openings can be reversed in the cold plate design shown in any of FIGS. 8A–10C.

Another embodiment for a dual passage cold plate is shown in FIGS. 10A–10C. In this particular embodiment, instead of providing serpentine, interdigitated passages, passages 405 and 406 are straight but still maintain their interdigitated geometry. Instead of having a serpentine geometry, each set of passages is instead served by an entrance and exit manifold. For example, upper passages 405 in FIG. 10A are served by manifold 407 which is in flow communication with coolant connection opening 402. Cooling fluid flows in through opening 402 to manifold 407 through passages 405 to exit manifold 408 and alternately to exit opening 404. A corresponding function is provided via entrance opening 403 which serves a manifold which supplies passages 406 which empties into an exhaust manifold which in turn supplies heated coolant fluid to exit opening 401 which services the lower set of cooling passages.

Figure 11B:
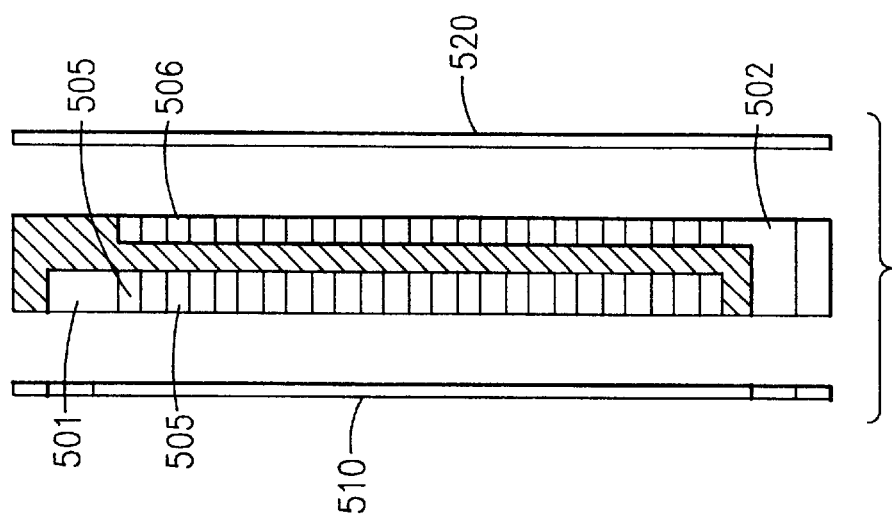
FIG. 11B illustrates a cross-sectional view through the cold plate of FIG. 11A.
Figure 11A:
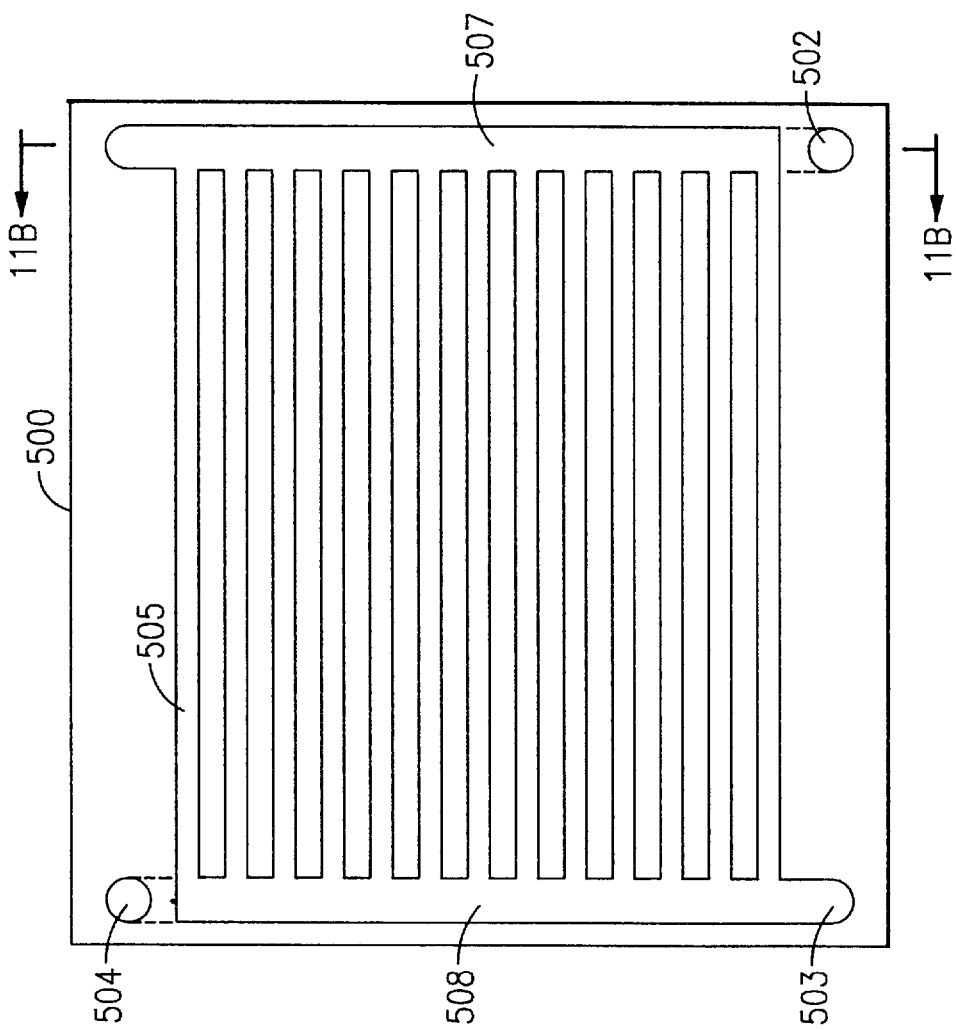
FIG. 11A is a view similar to FIG. 10A but particularly illustrating an embodiment in which the flow channels in the top and bottom portions are disposed adjacent to one another instead of being in alternating positions.

A fourth embodiment of a dual passage cold plate is shown in FIGS. 11A and 11B. In this embodiment, a multiplicity of straight passages 505 and 506 are provided on each side of central block 500. Upper passages 505 in FIG. 11A are served by manifold 507 which is in flow communication with coolant connection opening 501. Cooling fluid flows in through opening 501 to entrance manifold 507 through passages 505 to exit manifold 508 and through outlet opening 503. A corresponding function is provided for the lower set of passages via entrance opening 502 which supplies passages 506 emptying into an exhaust manifold allowing heated coolant to leave via exit opening 504. It should be understood that, in this arrangement, heat entering the cold plate structure across bottom plate 520 has a greater distance to travel to reach upper passages 505 and thereby exhibits a greater thermal resistance than for bottom passages 506, all other things being equal. It should be appreciated, however, that an increased number of cooling passages may be placed in the cold plate in this configuration and that, additionally, an increased number of passages 505 may be used on the top than on the bottom so as to offset the longer heat flow path and provide the same overall thermal resistance whether coolant flows through upper passages 505 or lower passages 506.

The upper and lower plates for the cold plates illustrated in FIGS. 8–11 are affixed to central blocks 200, 300, 400, 500 in any convenient fashion. For example, they can be attached by brazing, soldering or even by gluing. However in the case of attachment via epoxy, it is desired that the thermal resistance created by the attachment, particularly for the lower cover, is within an acceptable range. As indicated above, it is one of the primary objectives of the cold plate design employed herein to preserve flow-wise isolation between the coolant flow in the two sets of passages. It should be particularly noted that the embodiments illustrated in FIGS. 9A, 9B, 10A, 10B, 10C, 11A and 11B are particularly advantageous in this regard. These embodiments completely eliminate the possibility of fluid leaking between the two circuits within the cold plate.

In preferred embodiments of the present invention, it is clearly desirable that the cold plate be made as flat as possible to conform to the exterior packaging of electronic module 151. However, in those circumstances in which module 151 comprises a curved or even a stepped design, it is nonetheless possible to provide an appropriate cold plate by correspondingly machining or molding one of the upper or lower plates (covers) shown in FIGS. 8–11. However, in general, a good flat thermal mating surface is preferable.

Figure 12:
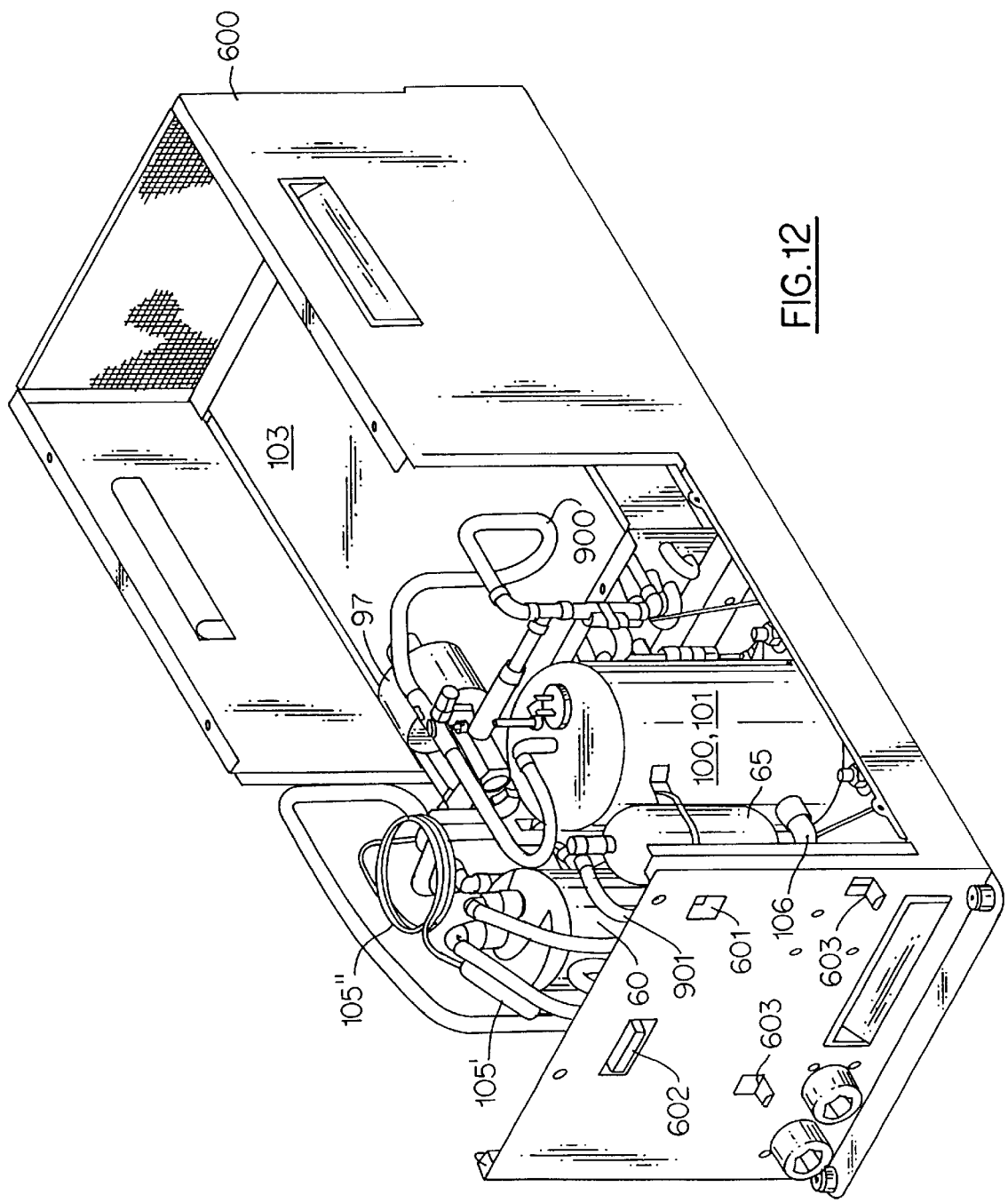
FIG. 12 is an isometric view illustrating the modular refrigeration unit of the present invention with covers removed to provide an internal view of the configuration of its subcomponents and also particularly illustrating anti-vibration tubing configuration.

FIG. 12 is an isometric view illustrating a preferred configuration for one side of the modular refrigeration system illustrated in FIG. 2. In particular, it is seen that cabinet or housing 600 contains condenser 103 which is of substantially standard design except that it preferably includes S-shaped aluminum fins Which create an improved flow of cooling air through condenser 103. Furthermore, condenser 103 preferably includes tubing having rifled internal ridges to improve its efficiency. These are fine internal ridges which help to promote heat transfer. Likewise, FIG. 12 illustrates the presence of motor/compressor unit 100, 101, hot gas bypass valve 97 and two portions, bulb 105' and coiled loop 105", of the thermal expansion device. Large accumulator 60, together with smaller accumulator 65, are also shown. It is also important to note the presence of loops 900 and 901 in coolant conduits. These loops have been seen to be very desirable additions to the structure in that they help to eliminate vibration in the system. Vibration could otherwise be a problem particularly at low motor speeds.

Figure 13:
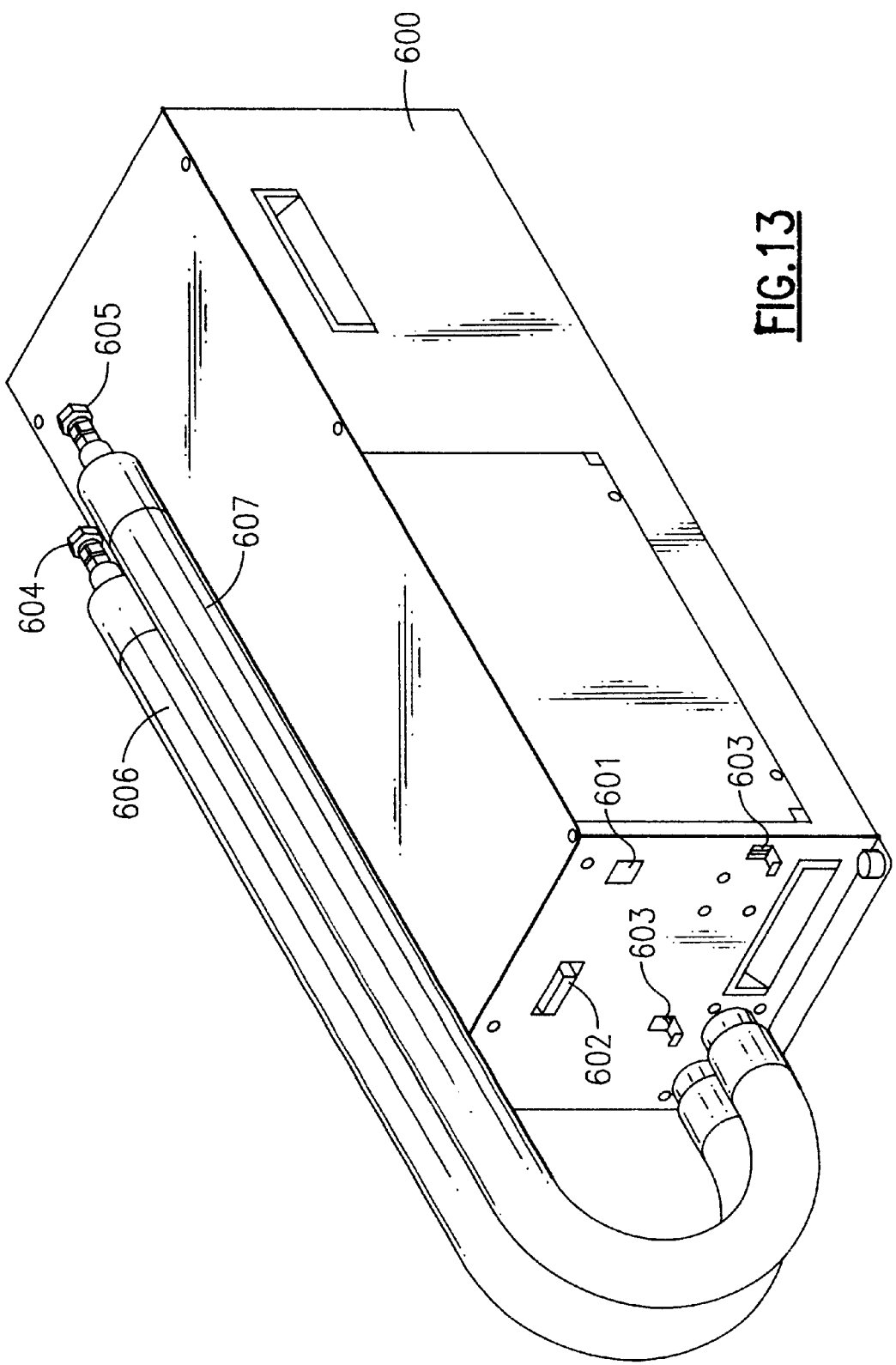
FIG. 13 is an isometric view similar to FIG. 12, but more particularly illustrating a closed MRU together with its quick disconnect connectors for attachment to a cold plate and/or evaporator.

It is also noted that cabinet or housing 600 includes four pin socket 601 for supplying power to motor/compressor 100,101 and bracket 603 for supporting a printed circuit board containing control circuitry. Signals to and from this board may be supplied via multi-pin DIN socket 602. Connection to evaporator/cold plate 150 is provided through quick disconnect couplers 604 and 605. FIG. 13 more particularly shows the closed cabinet together with quick disconnect conduits 606 and 607 which are attached to quick disconnect sockets 604 and 605, respectively, as a means for supplying cooled refrigerant to evaporator/cold plate 150.

Figure 14:
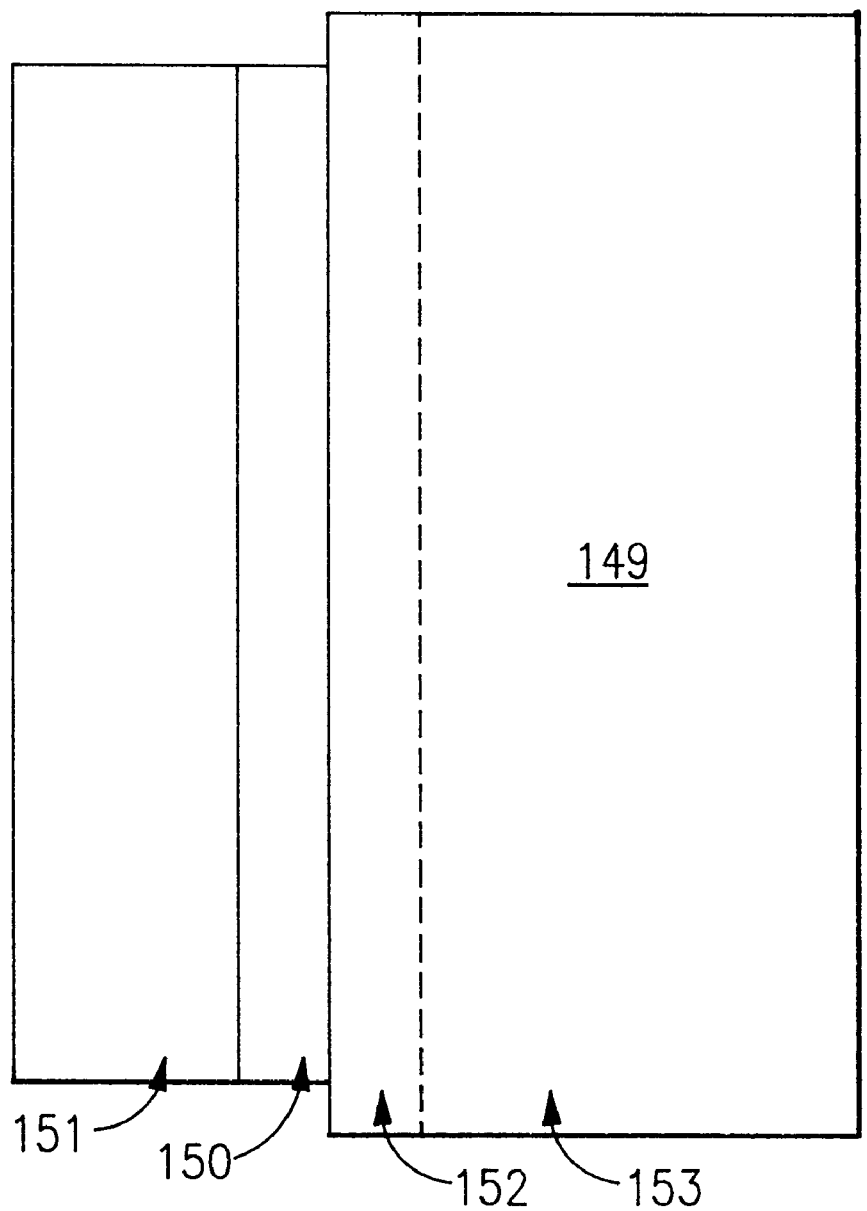
FIG. 14 is a side elevational view illustrating the arrangement of components in one embodiment of a hybrid auxiliary cooling system in accordance with the principles of the present invention.

FIGS. 14, 15A & 15B depict one embodiment of another aspect of the present invention, wherein a hybrid auxiliary cooling system is provided. In FIG. 14, the hybrid auxiliary cooling system is employed for again cooling an electronic module 151. As noted above, in one embodiment, module 151 can include circuits for data processor components associated with a mainframe or server computer system. Cold plate 150 is thermally coupled to an exposed surface of electronic module 151 via, for example, a separable oil interface. In accordance with the principles of the present invention, an auxiliary heat sink 149 is thermally coupled to electronic module 151, for example, across cold plate 150 as shown in FIG. 14. Auxiliary heat sink 149 includes a base plate 152 and a plurality of fins 153 extending outward from base plate 152. Auxiliary heat sink 149 is mechanically or metallurgically bonded to cold plate 150 for good thermal coupling between the heat sink 149 and the cold plate 150. By way of example, the auxiliary heat sink could be solder or brazed to the cold plate, or in an alternate embodiment, the cold plate and heat sink could be formed as an integrated component.

In accordance with the invention, cold plate 150 could comprise any one of a variety of different configurations, such as a water cooled cold plate or an evaporative plate. Further, auxiliary heat sink 149 could comprise a variety of different conductive materials and design configurations for an air flow heat sink. By way of example, but without limitation, cold plate 150 could comprise a dual passage cold plate constructed as depicted in FIGS. 8A–10C. The auxiliary heat exchanger itself may be constructed in several different ways, such as by extrusion or bonded fins. By way of further example, air flow heat sinks are described in detail in U.S. Pat. Nos. 5,630,469 and 5,304,846, which are incorporated herein by reference in their entirety.

Except for the depicted addition of auxiliary heat sink 149 and the omission of the refrigerant system components, FIGS. 15A & 15B are similar to the computer system embodiment depicted in FIGS. 1A & 1B and described above. A cabinet 10' has an inlet opening 11 and outlet opening 12 for the passage of air therethrough. The flow of air is induced by means of one or more blowers 15. Fans or other air-moving devices could also be employed for this same purpose. In the apparatus shown in FIG. 15A, air moves from inlet 11 in cabinet 10' to exhaust 12 along multiple air flow lines 13, part of which (shown in phantom) pass through auxiliary heat exchange 149. The flow of air is conventionally employed for the particular purpose of cooling certain of the electronic components disposed on printed circuit cards or so-called "books" 20. Air flows down between these books or cards through blower(s) 15 to plenum 16 and thereafter through cards 20 on the other side of motherboard 50. Having flowed past cards 20, airstream 13 exits through exhaust 12 in cabinet 10'.

Advantageously, in accordance with the principles of the present invention air flow to cabinet 10' also passes through auxiliary heat sink 149 to provide auxiliary cooling to electronic module 151 thermally coupled to the auxiliary heat sink across cold plate 150. Additionally, the hybrid auxiliary cooling system of the present invention can be controlled such that air flow across auxiliary heat sink 149 is actually cooled due to the heat sink's thermal coupling to the cold plate which in turn operates to cool other components within the computer system, i.e., to generally cool the ambient temperature inside cabinet 10'.

Area 17 shown in FIGS. 15A & 15B may include the same components as in the top half of the cabinet. Additionally, area 17 may also include power supply components (a power cage for example) along with its own air-moving device. However, the components disposed in area 17 are not otherwise relevant. In one embodiment, a refrigeration system would be disposed within area 900 for providing cooling circulation fluid or refrigerant fluid to cold plate 150, for example, as explained above in connection with the dual passage cold plate 150 of FIGS. 8A–10C. Different refrigerant systems are also depicted and described above with reference to FIGS. 2–6.

To summarize this aspect of the invention, a hybrid air cooling system and refrigerated (chilled) system is disclosed. In this hybrid auxiliary cooling system a common cold plate, such as a water cooled cold plate, is thermally coupled to an electronics module of a computer system. Under normal operation conditions, the cold plate removes heat generated by the electronic module to a circulation fluid, such as water. Conventionally, the circulation coolant is contained within a closed loop. A circulator moves the coolant through the cold plate to the refrigeration system heat exchanger where the absorbed heat is dumped into the refrigeration system refrigerant. The refrigeration system can be any of a number of common systems including, but not limited to mechanical compression types. Further, the refrigeration system could be either a standard chiller unit, supplying chilled water to a water cold plate, or an evaporation refrigerator, supplying a refrigerant to the cold plate. In the latter case, the cold plate would comprise an evaporative plate.

Use of a cold plate is sufficient to reduce the electronics device temperature to values substantially below what is possible with an air cooled heat sink. However, under certain circumstances, a refrigeration system may fail, in which case the electronics device temperature would quickly reach an unacceptably high temperature, forcing a system shutdown. Thus, in accordance with the principles of the present invention, an auxiliary air cooled heat sink is coupled to the cold plate to prevent shutdown of the system even during a refrigeration system malfunction. The auxiliary heat sink is preferably thermally and physically attached to the cold plate, for example, brazed, soldered, or connected by means of a consistent set of machine screws.

In one application, under normal operation, no air flow through the heat sink is required, i.e., the cold plate is assumed to be sufficient to cool the electronics module. A refrigeration system could be designed to allow the device to operate at room temperature (or even lower). In the event of a refrigeration malfunction, air would then be actively directed through the heat sink allowing the electronic module to continue to operate until the refrigeration system is repaired.

From the above, it should be appreciated that the systems and apparatus described herein provide a reliable redundant cooling system for computer and other electronic systems. It should also be appreciated that the cooling systems of the present invention permit the operation of computer systems at increased speeds. It should also be appreciated that the objects described above have been filled by the systems and methods shown herein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A cooling system for an electronic module of a computer system having at least one other component, said cooling system comprising:

a refrigeration cooled cold plate thermally coupled to said electronic module for removing heat generated by the electronic module via circulation fluid passing through said refrigeration cooled cold plate;

an auxiliary air flow heat sink thermally coupled to said electronic module, said auxiliary air flow heat sink comprising supplementary cooling for said electronic module upon failure of said refrigeration cooled cold plate thermally coupled to said electronic module; and wherein when said refrigeration cooled cold plate is operational, air flow across said auxiliary air flow heat sink is cooled by said refrigeration cooled cold plate thermally coupled to said electronic module, and wherein said cooled air flow operates to cool said at least one other component of said computer system.

2. The cooling system of claim 1, wherein said auxiliary air flow heat sink is physically attached to said refrigeration cooled cold plate and thermally coupled to said electronic module across said refrigeration cooled cold plate.

3. The cooling system of claim 2, wherein said electronic module comprises at least one of a mainframe processing unit or a server processing unit.

4. The cooling system of claim 3, wherein said cooling system is adapted for positioning within said computer system, and further including a blower for actively moving air across said auxiliary air flow heat sink.

5. The cooling system of claim 4, wherein said refrigeration cooled cold plate comprises one of a chilled water cooled cold plate or an evaporative cooled cold plate.

6. The cooling system of claim 1, wherein said refrigeration cooled cold plate includes at least two isolated passageways for accommodating circulation fluid from two separate refrigeration systems such that said cooling system comprises multiple independent cooling subsystems.

7. A method for cooling a computer system having an electronic module and at least one other component, said method comprising:

providing a refrigeration cooled cold plate thermally coupled to said electronic module for removing heat generated by the electronic module via circulation fluid passing through the refrigeration cooled cold plate; and providing an air flow heat sink thermally coupled to said refrigeration cooled cold plate, said air flow heat sink being operable in one mode to cool air passing therethrough via its thermal coupling to said refrigeration cooled cold plate, wherein said cooled air flow operates to cool said at least one other component of said computer system.

8. A method for fabricating a cooling system for a computer system having an electronic module and at least one other component, said method comprising:

providing a refrigeration cooled cold plate and thermally coupling said refrigeration cooled cold plate to said electronic module for removing heat generated by the electronic module; and thermally coupling an air flow heat sink to said electronic module across said refrigeration cooled cold plate for auxiliary cooling of said electronic module upon failure of said refrigeration cooled cold plate; and wherein said thermally coupling comprises disposing said air flow heat sink on said refrigeration cooled cold plate so that when operational, air flow across said air flow heat sink is cooled by said refrigeration cooled cold plate and so that said cooled air flow operates to cool said at least one other component of said computer system.

9. The method of claim 8, wherein said thermally coupling of said air flow heat sink to said electronic module comprises mechanically connecting said air flow heat sink to said refrigeration cooled cold plate such that said air flow heat sink is thermally coupled to said electronic module across said refrigeration cooled cold plate.

10. The method of claim 9, further comprising actively moving air across said air flow heat sink thermally coupled to said electronic module.

11. The method of claim 8, wherein said providing of said refrigeration cooled cold plate comprises providing said refrigeration cooled cold plate with at least two isolated passageways for accommodating circulation fluid from two separate refrigeration systems such that said cooling system comprises multiple independent cooling subsystems, said multiple independent cooling subsystems comprising said two separate refrigeration systems and said air flow heat sink.

* * * * *